United States Patent [19]
Hiyamizu et al.

[11] Patent Number: 5,951,756
[45] Date of Patent: Sep. 14, 1999

[54] METHOD OF FORMING GAAS/ALGAAS HETERO-STRUCTURE AND GAAS/ALGAAS HETERO-STRUCTURE OBTAINED BY THE METHOD

[75] Inventors: Satoshi Hiyamizu, Kobe; Satoshi Shimomura, Kawanishi; Yasunori Okamoto, Nishinomiya, all of Japan

[73] Assignee: Kubota Corporation, Osaka, Japan

[21] Appl. No.: 08/799,830

[22] Filed: Feb. 13, 1996

Related U.S. Application Data

[62] Division of application No. 08/523,806, Sep. 5, 1995, Pat. No. 5,679,179, which is a continuation of application No. 08/120,150, Sep. 14, 1993, abandoned.

[51] Int. Cl.$^6$ .................................................. C30B 25/02
[52] U.S. Cl. ........................................... 117/101; 117/902
[58] Field of Search ................................. 117/101, 902; 148/33.4

[56] References Cited

U.S. PATENT DOCUMENTS

| | | | |
|---|---|---|---|
| 5,081,511 | 1/1992 | Tehrani et al. | 257/192 |
| 5,153,890 | 10/1992 | Bona et al. | 372/48 |
| 5,298,441 | 3/1994 | Goronkin et al. | 438/172 |
| 5,679,179 | 10/1997 | Hiyamizu et al. | 148/33.4 |

OTHER PUBLICATIONS

"Influence of Substrate Orientation on Be Transport during Molecular Beam Epitaxy of AlGaAs/GaAs Heterojunction Bipolar Transistors," Mochizuki et al; Japanese Journal of Applied Physics, vol. 31 (1992) pp. 3495–3499, Part 1, No. 11 Nov. 1992.

*Primary Examiner*—Felisa Hiteshew
*Attorney, Agent, or Firm*—Hazel & Thomas, P.C.

[57] ABSTRACT

A method of forming GaAs/AlGaAs hetero-structure. The method includes the steps of preparing a GaAs substrate having a (411)A-oriented surface and setting the GaAs substrate inside a growth container with the (411)A surface being disposed as a surface to be deposited. The pressure inside the growth chamber is reduced and the GaAs substrate is heated up to a predetermined temperature to cause epitaxial growth of Ga, Al, As on the (411)A substrate and forming a GaAs/AlGaAs hetero-structure on the (411)A-oriented GaAs substrate.

5 Claims, 13 Drawing Sheets

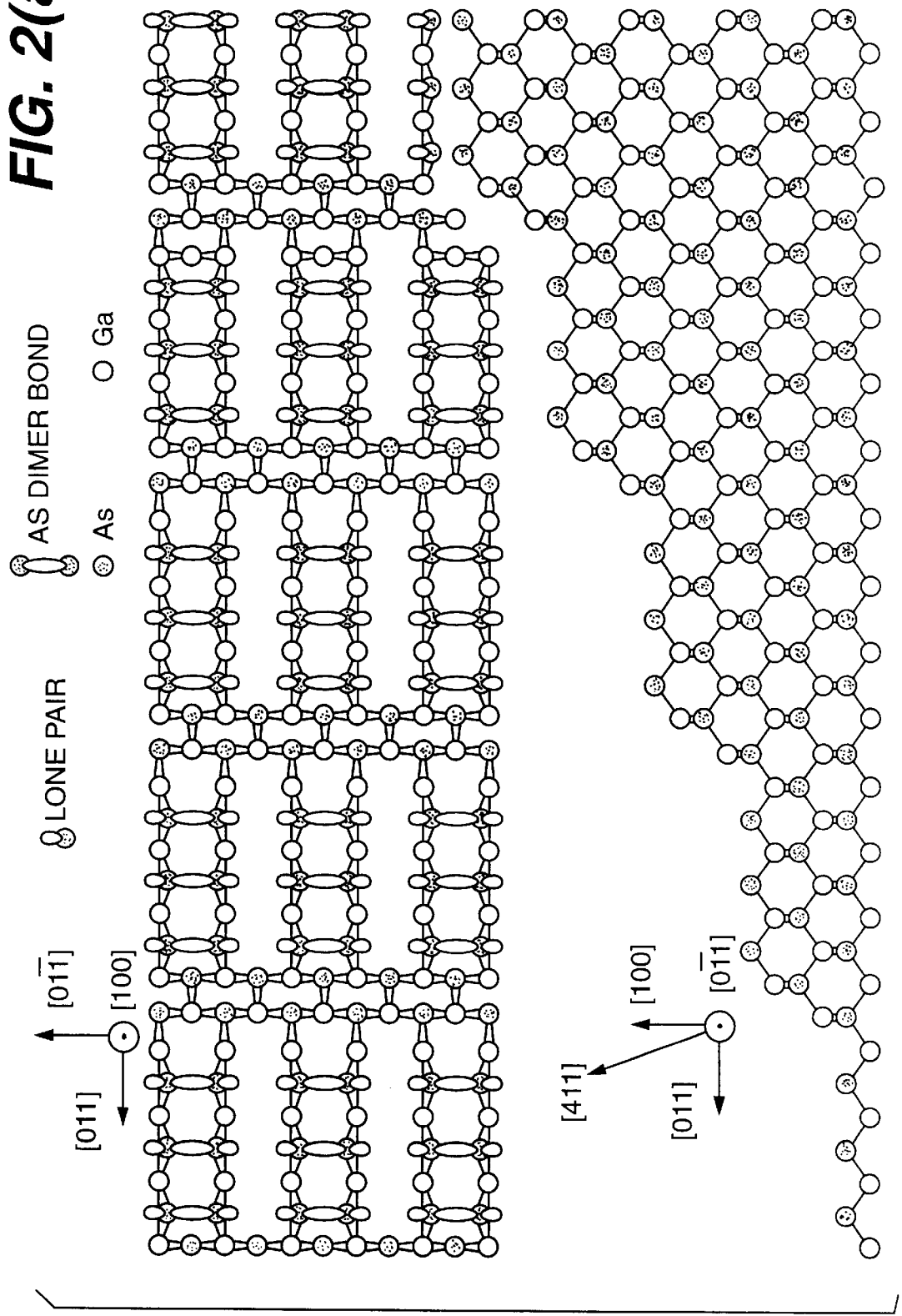

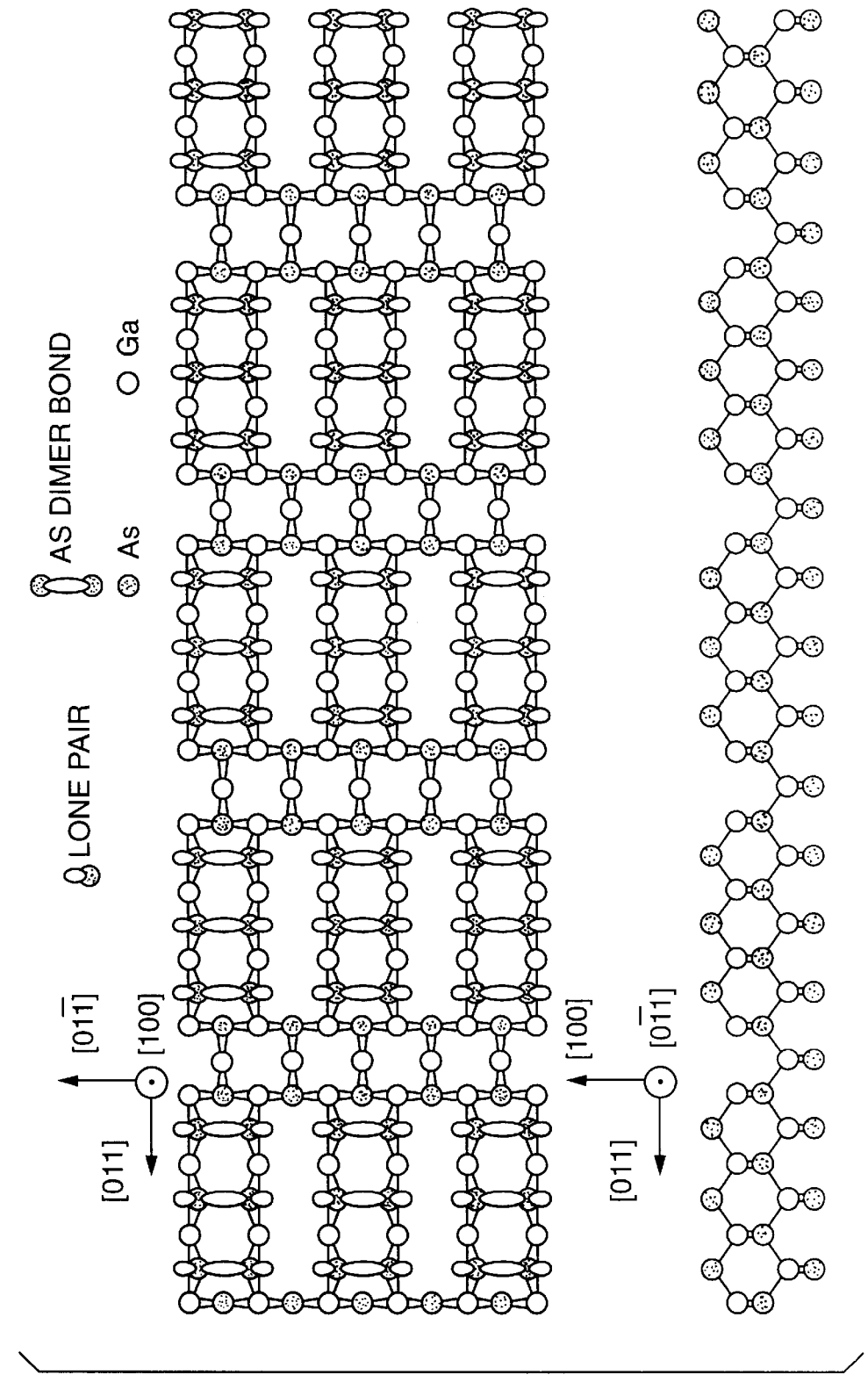

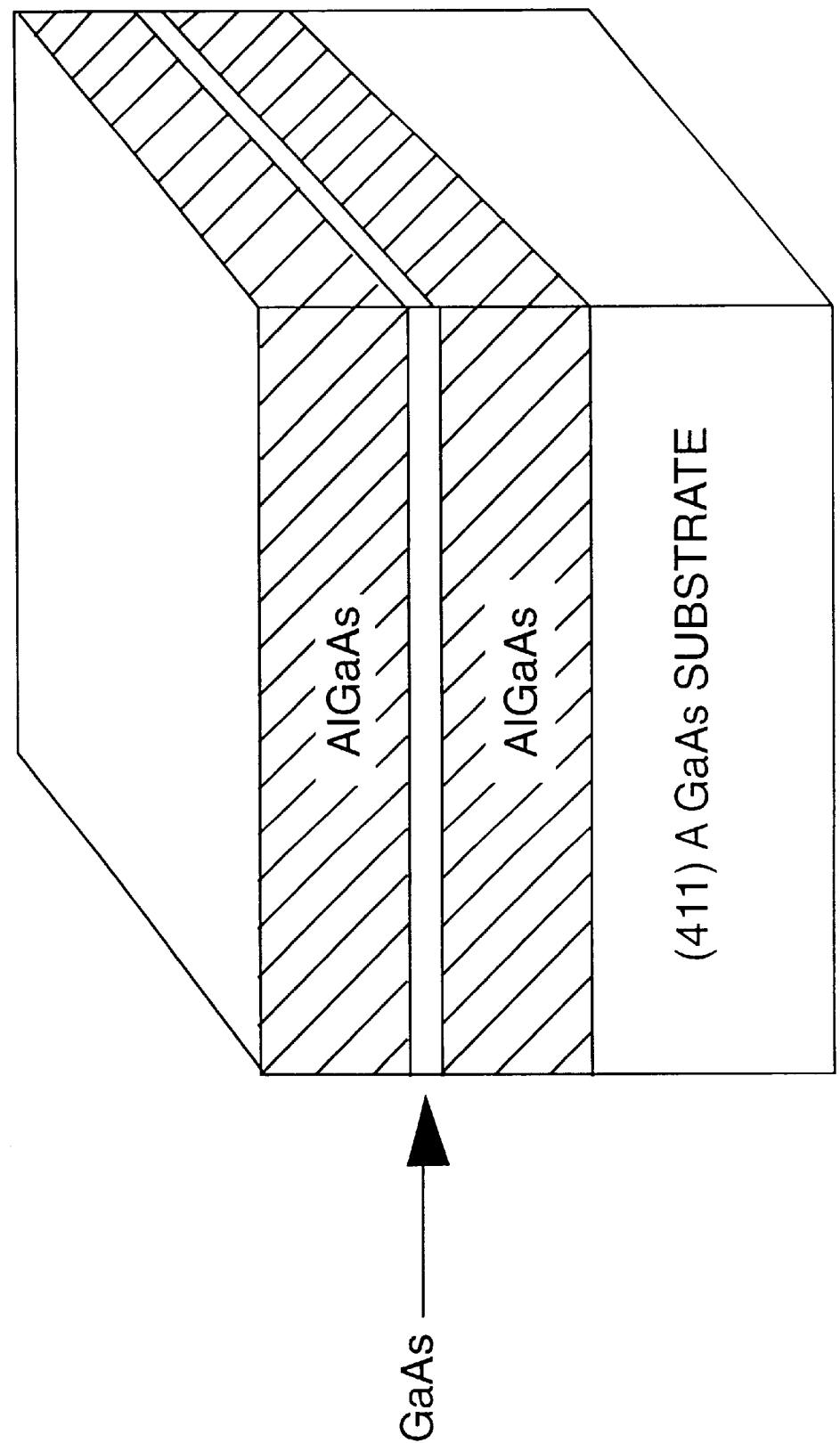

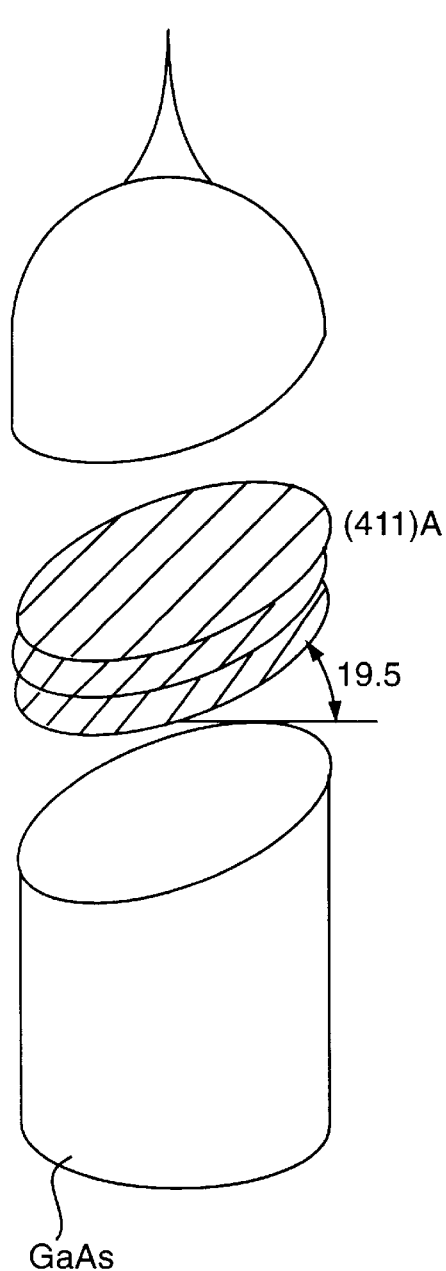 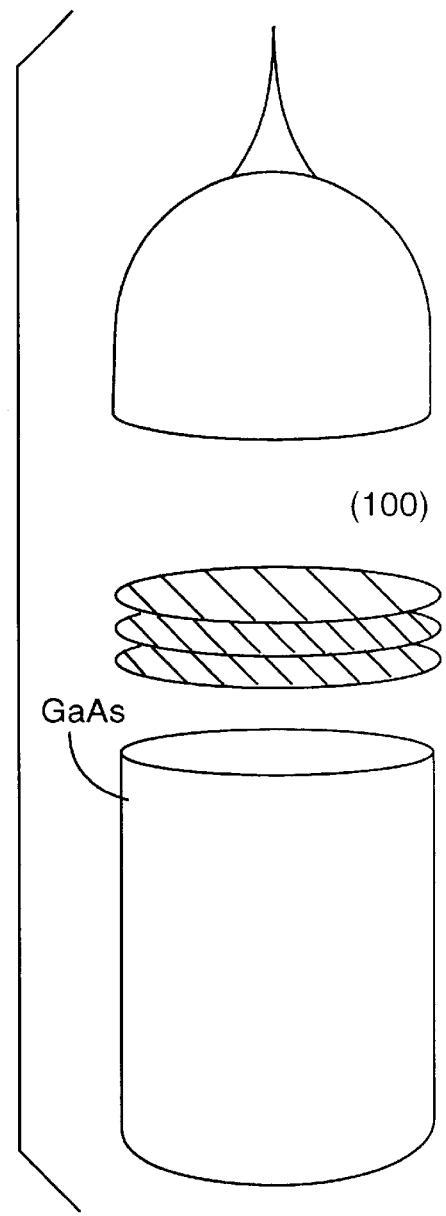
FIG. 4A  FIG. 4B

0 sec.

0 sec.

10 sec.

10 sec.

30 sec.

30 sec.

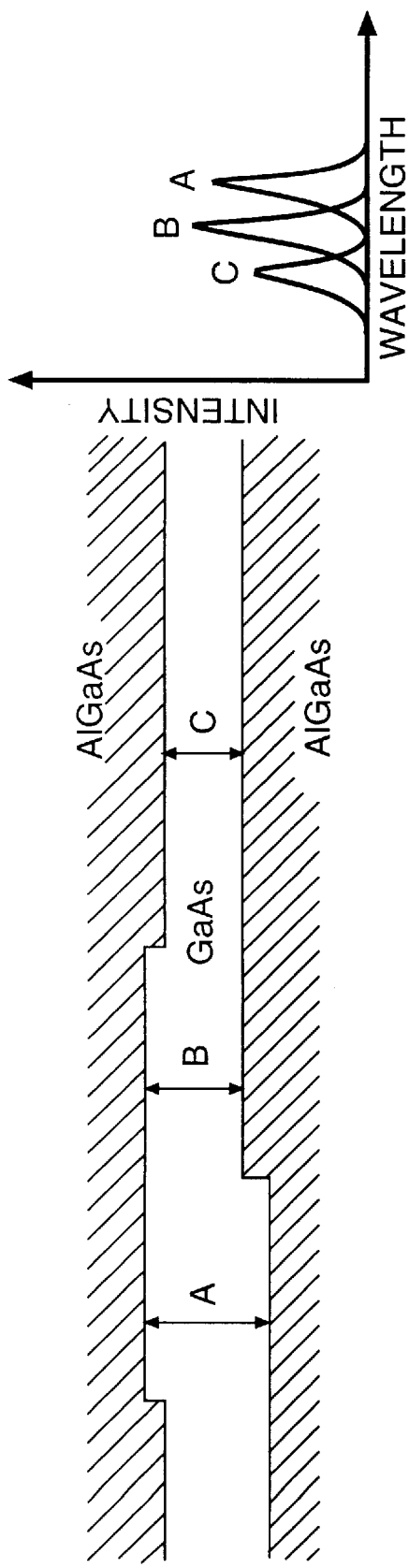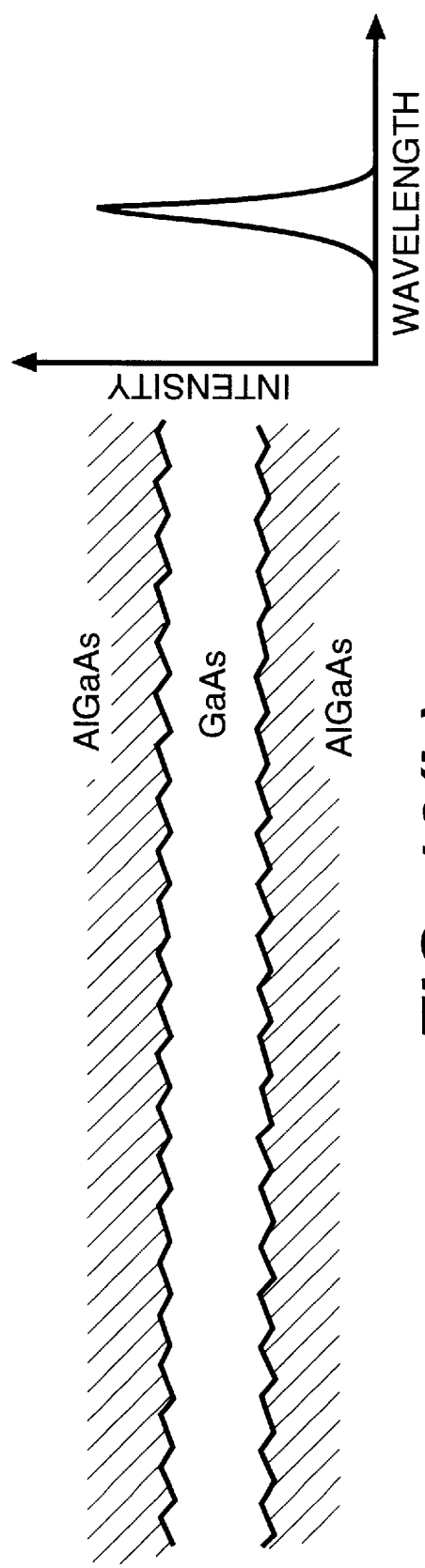
FIG. 10(a)
FIG. 10(b)

METHOD OF FORMING GAAS/ALGAAS HETERO-STRUCTURE AND GAAS/ALGAAS HETERO-STRUCTURE OBTAINED BY THE METHOD

This application is a Divisional of application Ser. No. 08/523,806, filed Sep. 5, 1995, which is a Continuation application of Ser. No. 08/120,150, filed Sep. 14, 1993, now abandoned.

BACKGROUND OF THE INVENTION

1. Field of the Invention

The present invention relates to a method of forming GaAs/AlGaAs hetero-structure and GaAs/AlGaAs hetero-structure obtained by the method.

2. Description of the Related Art

Conventionally, MBE (molecular beam epitaxy) growth of GaAs or AlGaAs layer on GaAs substrates has been done on the (100) surface. While the superiority of optical and electronic properties of the semiconductor layer grown on the (100) surface has been demonstrated by the success of various devices such as a laser device or HEMT (high electron mobility transistor), in recent years, growth on other surfaces than the (100) surface have also been attempted with various motivations.

However, GaAs/AlGaAs hetero-structures grown on the (100) surface have room for improvement in the atomic flatness of hetero-interfaces, and this leads to rather unsatisfactory results in their optical and electrical properties.

GaAs/AlGaAs quantum wells grown on GaAs (100) substrates with the growth interruption show much narrow luminescence peaks in PL spectra. Existence of one-monolayer atomic steps at the hetero-interfaces of the quantum wells (well width of Lo) grown with the growth interruption, however, results in three kinds of wells with different thicknesses (Lo, Lo±1 ML) laterally coexisting in an area excited by a laser beam which leads to three luminescence peaks in the PL spectra for a single quantum well. It is still difficult to eliminate this atomic step structure at the interface even by the growth interruption technique. Dimension of island by this atomic step at the GaAs/AlGaAs interface is around several um as determined by scanning cathodoluminescence technique. This atomically flat area is much smaller than a contact area of a semiconductor hetero-structure device, so it has been difficult to use an atomically flat interface in real devices.

Taking the above-described state of the art into consideration, a primary object of the present invention is to provide a method of forming GaAs/AlGaAs layer with much improved hetero-interface, which results in further improved optical and electrical properties.

SUMMARY OF THE INVENTION

For accomplishing the above-noted object, a method of forming GaAs/AlGaAs hetero-structure, according to the present invention. comprises the steps of preparing a GaAs substrate having a (411)A-oriented surface and setting the GaAs substrate inside a growth chamber with the (411)A surface being disposed as a surface to be deposited. The pressure inside the growth chamber is reduced and the GaAs substrate is heated up to a predetermined temperature to cause epitaxial growth of AlGaAS on the (411)A substrate and forming a GaAs/AlGaAs hetero-structure on the (411) A-oriented GaAs substrate.

FIG. 2(a) shows a sample model structure of the GaAs (411)A surface. This structure includes (100) surface comprised of As surface and (111)A surface comprised of Ga surface and rises stepwise by two molecular layers in the direction of the (100) surface. As on the (100) surface together with As vicinal thereto form a dimer. Other structures too are conceivable for the (411)A surface. Yet, the above-described structure is supposed to be the most stable structure from the view point of bond analysis.

This structure is similar to the missing dimer model (see FIG. 2(b)) of the (2×4) structure for As-stabilized GaAs (100) surface. The missing dimer model was anticipated from observation of RHEED (reflecting high-speed electron beam diffraction) pattern and was confirmed by STM observation.

In MBE growth of GaAs/AlGaAs on a GaAs channeled substrate, the (411)A surface is one of most familiar facet to be preferentially grown. Here, the mark 'A' relates to the front or rear orientation of the (411) surface and this mark 'A' denotes the front face where Ga has three crystal back bonds (the opposite side denoted by mark 'B'). FIG. 1 illustrates the growth of the (411)A surface. This (411)A surface does not originally exist on the GaAs channeled substrate consisting of the (100) surface and (111)A surface or on the GaAs channeled substrate consisting of the (100) surface and (755)A surface. On the latter channeled substrate, four periods of 200 nm GaAs epilayer and 50 nm AlAs epilayer were grown.

The growth temperature was 580 degrees in Celsius and the $As_4$/Ga pressure ratio was 30. It can be seen that the (411)A surface already appears after the growth of first GaAs epilayer with increasing width with the lapse of the growth time period. This growth of (411)A surface is attributable to the fact that the velocity of incorporation of Ga atoms having reached a crystal surface into the crystal structure varies according to the type of this crystal surface. The Ga atoms emitted from its source to reach the surface move about on the surface seeking for stable sites until the atoms are incorporated into the crystal structure. These atoms which 'migrate' without being incorporated into the crystal structure are referred to as 'adatoms'. On the (411)A surface, the atom incorporation takes place rather slowly, so that the adatom density is higher on this surface than on other surfaces. Hence, the adatoms on the (411)A surface migrate to the vicinal surfaces, which reduces the speed of crystal growth on the (411)A surface and consequently the selective growth on the same. As described above, on the (411)A surface, it takes a longer time period for Ga atoms to be incorporated into the crystal structure and the non-incorporated Ga atoms tend to migrate, which means that the (411)A surface will likely be developed into a flat surface thus achieving an atomically-flat hetero-interface.

Because of the higher migration rate on the (411)A surface which results in atomic flatness of the GaAs/AlGaAs hetero-interfaces over a larger area, it may be reasonably expected that the MBE growth on this (411)A surface will achieve even superior properties to those obtained by the growth on (100)-oriented substrate.

On this (411)A surface, the present inventors have, for the first time, formed a layer having GaAs/AlGaAs quantum well structure as illustrated in FIG. 3.

Thus, the present invention has achieved its intended object of providing a method of forming GaAs/AlGaAs layer with further improved optical and electrical properties.

More particularly, through RHEED observation of GaAs epilayer grown on (411)A-oriented GaAs substrate and through observation of photoluminescence of GaAs/AlGaAs quantum wells grown on the (411)A-oriented GaAs substrate, it can be seen that extremely atomically-flat hetero-interfaces were obtained over a larger area (larger than 200 um in diameter). Thus-obtained quantum well shows the full widths at half maxima (FWHMs) of the luminescence peaks narrower than those quantum wells grown on the (100)-oriented substrate and as narrow as the quantum wells obtained with the growth interruption method. This is probably because two-dimensional crystal growth is promoted as Ga atoms show a lower speed to be incorporated in the crystal structure and a longer migration distance on the (411)A surface than on the (100) surface. And, it was confirmed that this structure is stable for being fairly similar to the missing dimer model actually measured on the (100) surface.

Further and other objects, features and effects of the invention will become more apparent from the following more detailed description of the embodiment of the invention with reference to the accompanying drawings.

BRIEF DESCRIPTION OF THE DRAWINGS

FIGS. 2(a) and 2(b) are views for comparing crystal structure models of the GaAs (100) surface and (411)A surface, FIG. 3 is a view illustrating GaAs/AlGaAs quantum well structure grown on GaAs substrate, FIGS. 4(a) and 4(b) are views illustrating cutting-out methods for the (411)A surface, FIG. 10 is schematic diagrams of GaAs/AlGaAs quantum wells grown on (100)-oriented Ga As substrate with the growth interruption (a) and on (411)A-oriented substrate (b), only one photoluminescence peak being observed for the (411)A case (b), while three photoluminescence peaks being observed for the conventional case of (a).

DESCRIPTION OF THE PREFERRED EMBODIMENTS

Preferred embodiments of a method of forming Ga As/Al Ga As layer and Ga As/Al Ga As layer obtained by the method, both relating to the present invention, will now be described in details with reference to the accompanying drawings.

The GaAs substrates were etched by sulfuric acid enchant after degreasing. It was confirmed, through differential interference microscopic observation, that the substrate surface after the etching was flat. Further, as illustrated in FIG. 4(a), this substrate surface was prepared by cutting out the substrate with 19.5 degree inclination relative to the (100)A surface. Incidentally, FIG. 4(b) illustrates cutting out of the (l00)A surface for the purpose of comparison.

Figure 1A:
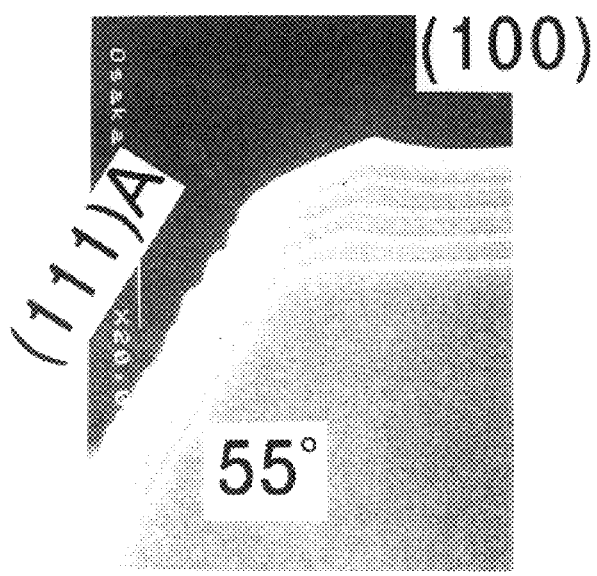
FIGS. 1(a) and 1(b) are photographs illustrating selective growth of GaAs (411)A surface.
Figure 1B:
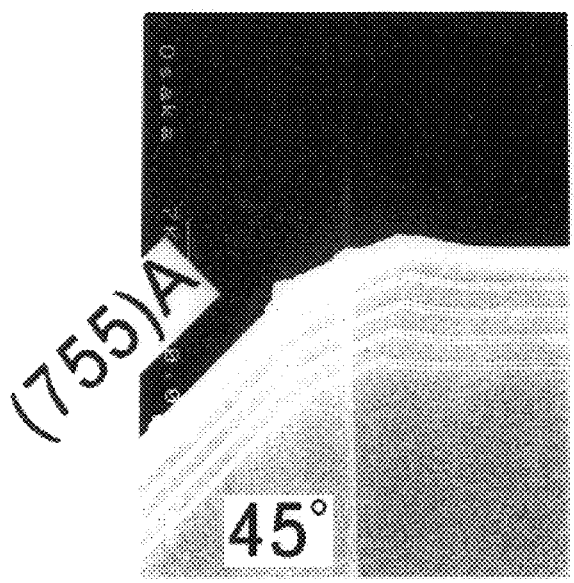
Figure 5A:
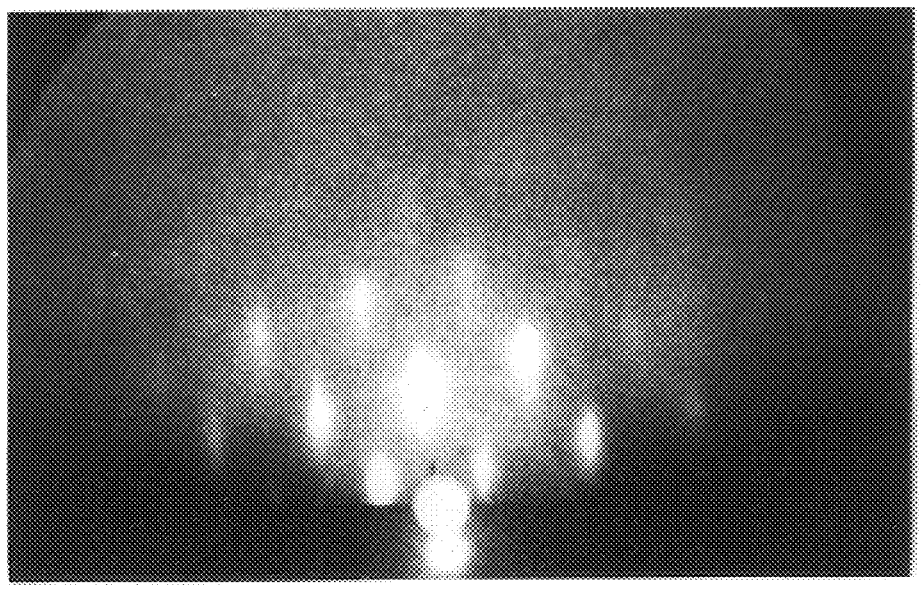
FIG. 5 is an RHEED photograph taken from the GaAs (411)A surface being grown in the MBE system.
Figure 5B:
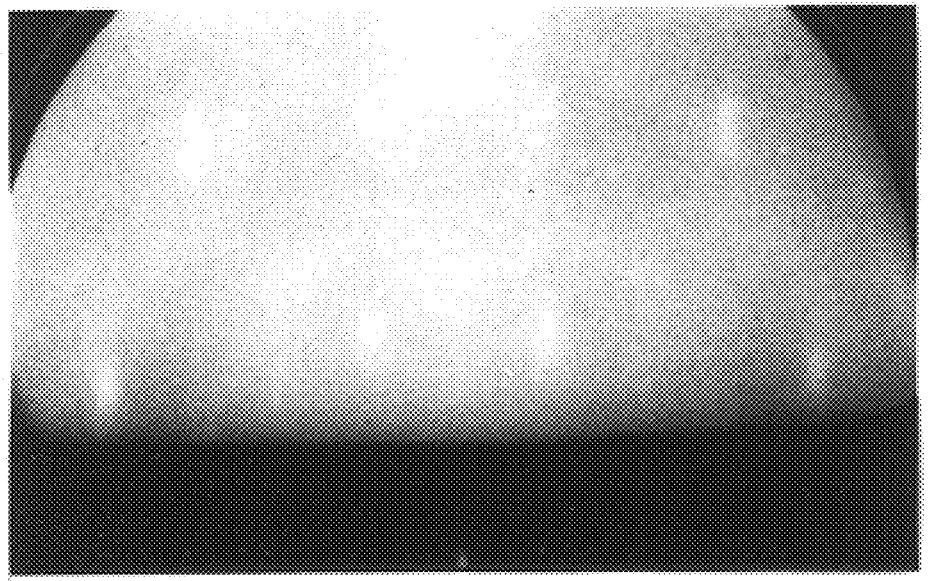
Figure 5C:
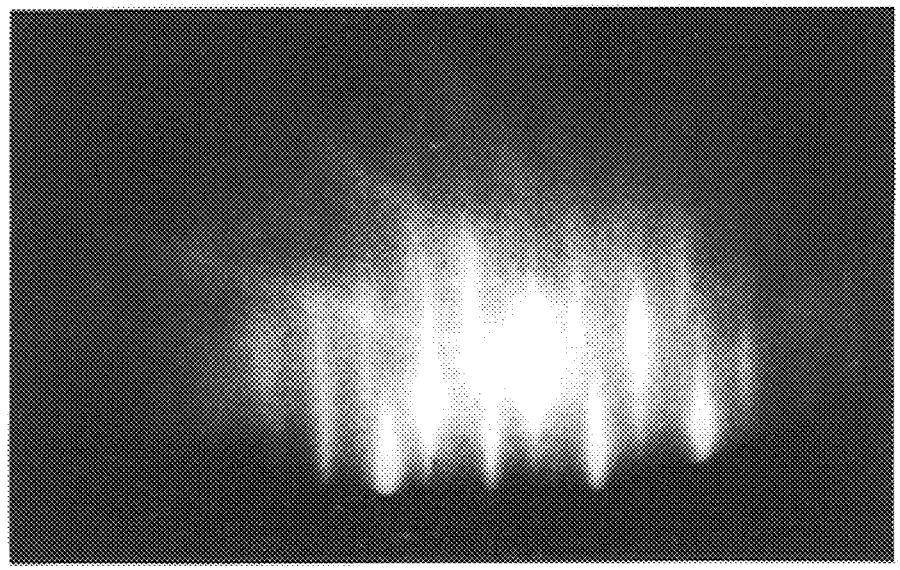
Figure 5D:
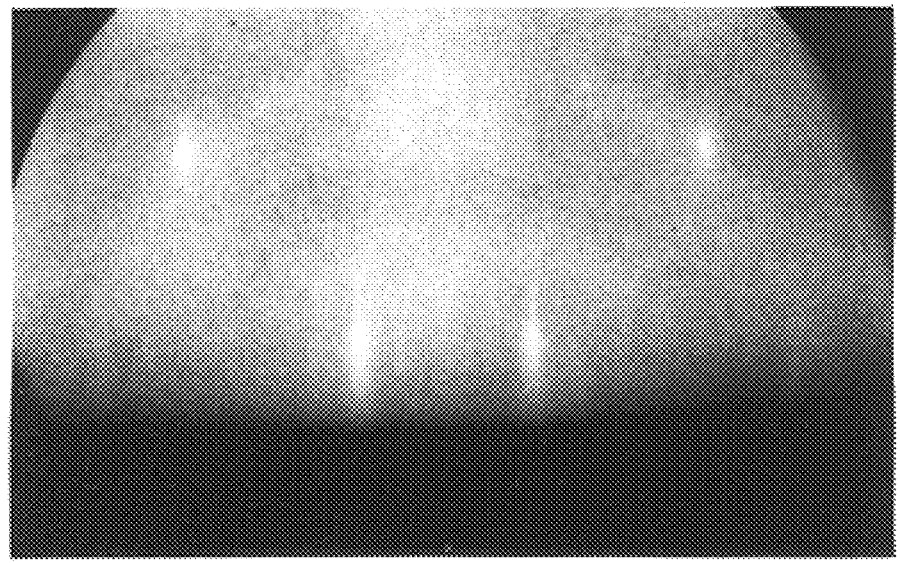
Figure 5E:
Figure 5F:
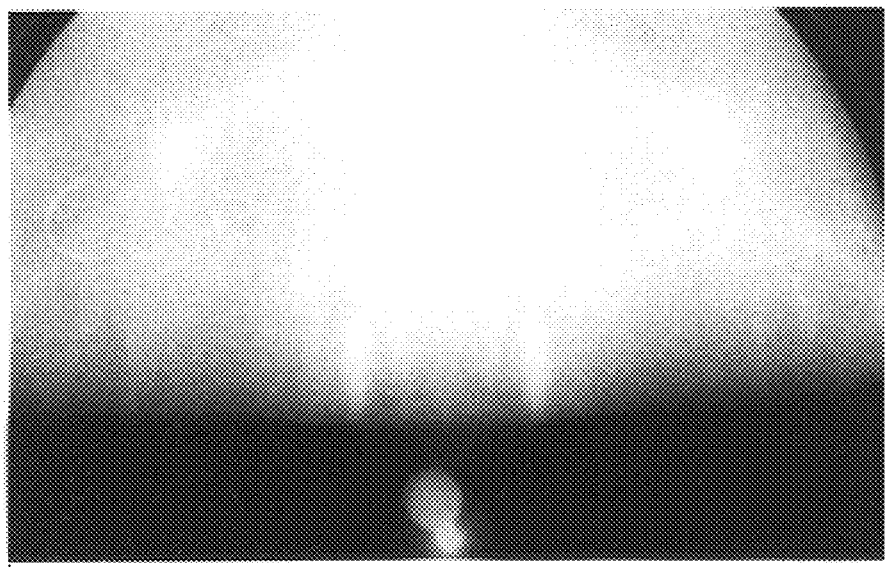
Figure 6:
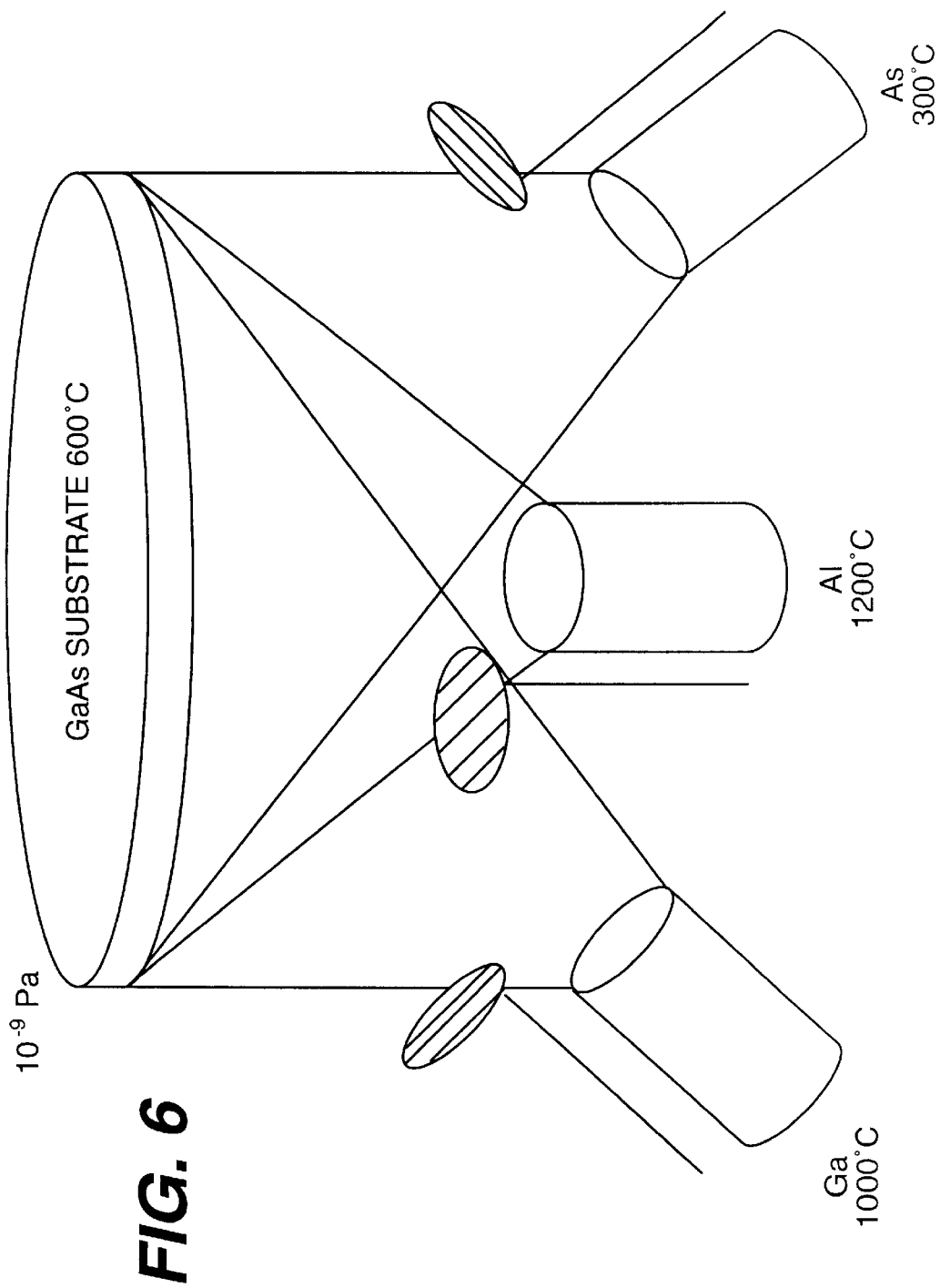
FIG. 6 is a conceptual view illustrating the formation of layer with the MBE system.

FIG. 5 shows RHEED (reflecting high-speed electron beam diffraction) patterns from the (411) A surface of the GaAs substrate in the course of the MBE growth. The growth was effected at the substrate temperature of 580 degrees in Celsius under V/III ($As_4$/Ga)=10 (pressure ratio), with reducing the pressure in the growth chamber of the MBE system approximately to $10^{-9}$ Pa. The growth rate of GaAs was 0.96 μm/h and that of AlAs was 0.41 μm/h, respectively. Further, the substrate was rotated at 60 rpm. FIG. 6 is a conceptual view illustrating the formation of layer with the MBE system by deposition of vapor of Al, Ga, As. These growth conditions were similar to those optimum in the case of the Ga As growth on the (100)-oriented substrate.

Prior to the growth, spotty diffraction patterns were observed for both [0$\overline{1}$1] and [$\overline{1}$22] azimuths, due to the microscopic three-dimensional structures present on the substrate surface. After 10 seconds of growth, the patterns became more streaky (extending vertically), indicating two-dimensional growth taking place on the substrate surfaces. In the patterns of [$\overline{1}$22] azimuth, two-fold diffraction was observed due to an As-dimer structure on the (411)A surface, satisfying the requirements for the (411)A surface model. After 30 seconds of growth, the streaky patterns become more conspicuous, and there occurred little change thereafter, implying stability of surface morphology of GaAs epilayer growth on the (411)A surface.

In applying III–V compound semiconductors to various devices, the essential consideration is given to atomic flatness of the hetero-interfaces. As discussed hereinbefore, on the (411)A surface it takes a longer period of time for Ga atoms to be incorporated into the crystal structure than on the other surfaces, so that a greater degree of atomic flatness can be expected from the growth on the (411)A surface.

Figure 7A:
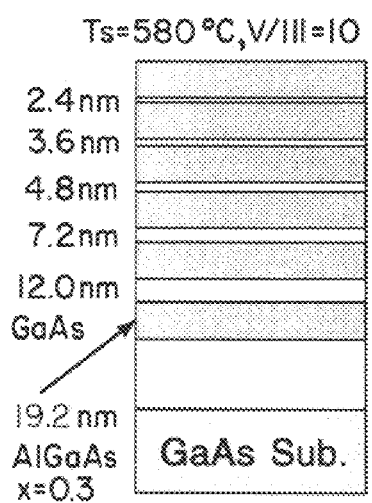
FIGS. 7(a), 7(b) and 7(c) are differential interference microscope photographs showing the formed surface grown with GaAs/AlGaAs quantum well structure.

In studying this atomic flatness, Ga As/Al Ga As quantum wells were simultaneously grown on the (411)A-surface and (100)-oriented Ga As substrates. The well widths were 2.3 nm, 3.5 nm, 4.6 nm, 6.9 nm and 11.5 nm, and AlGaAs barriers were 19.2 nm in thickness (see FIG. 7(a)). The MBE growth was done at 580 degrees in Celsius under $As_4$/Ga=10 (pressure ratio).

Figure 7B:
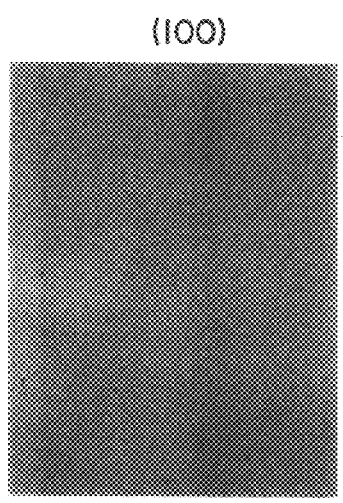
Figure 7C:
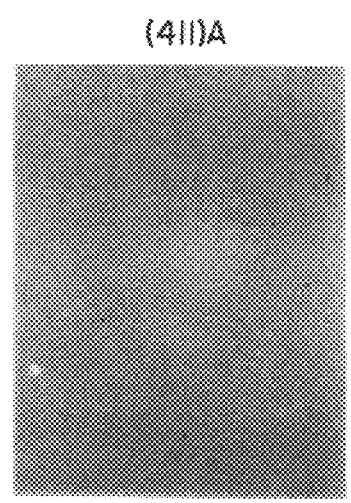

FIGS. 7(b) and 7(c) show differential interference microscope photographs of the (100) and (411)A surfaces with the grown quantum wells. As seen, the both surfaces of the epilayer were flat mirror surfaces.

Figure 8A:
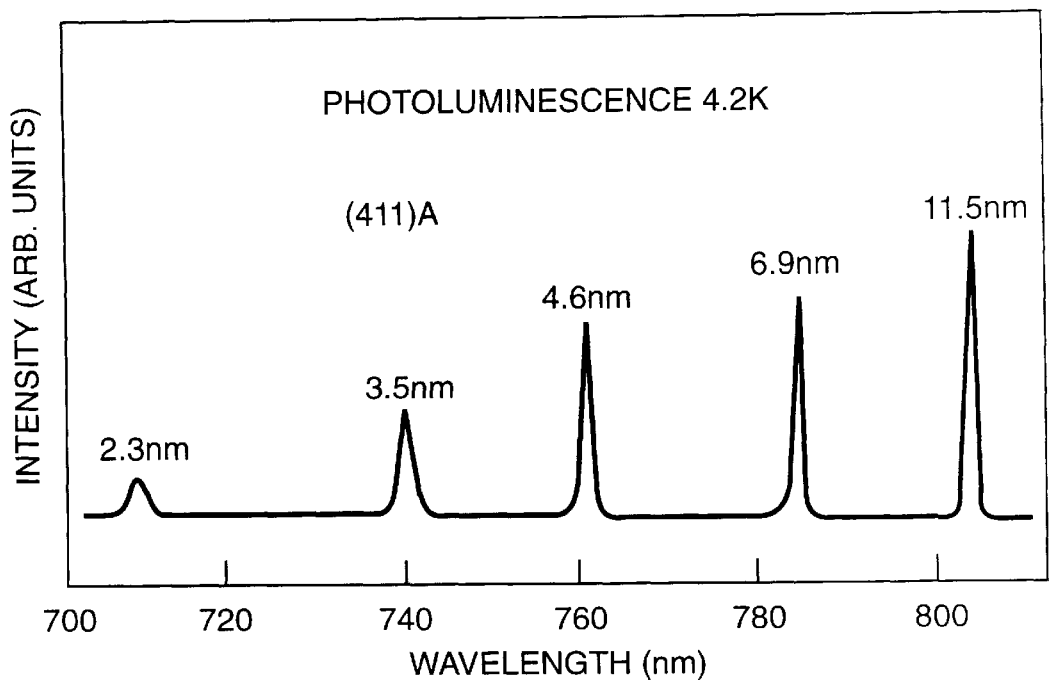
FIG. 8 shows photoluminescence spectra of the GaAs/AlGaAs quantum wells.
Figure 8B:
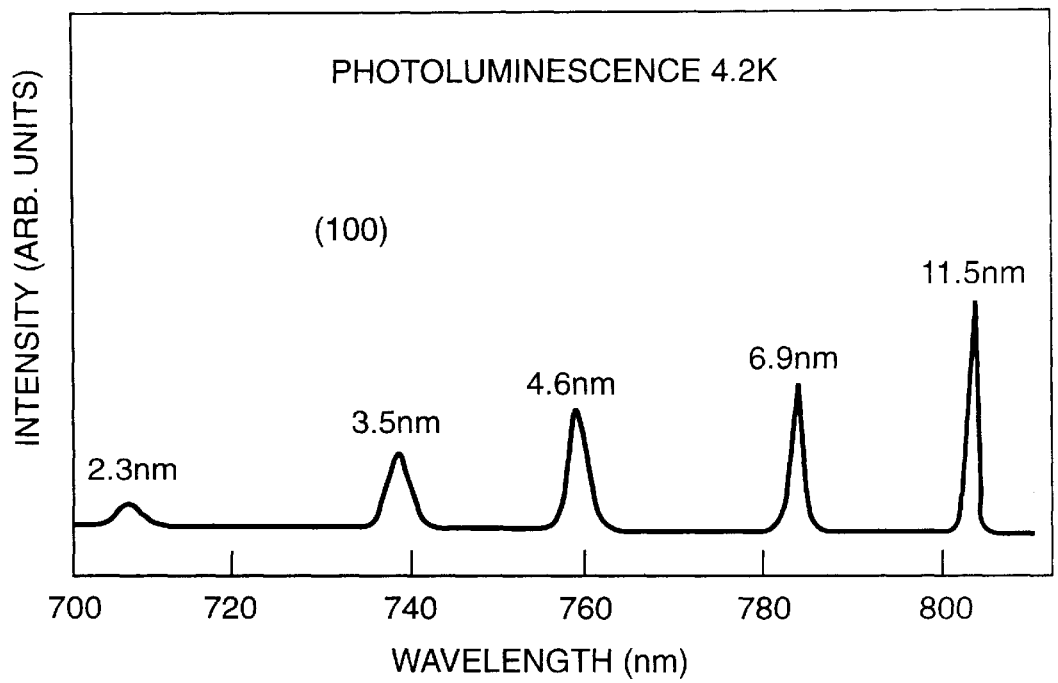

FIG. 8 show photoluminescence spectra at 4.2 K. The luminescence from the respective quantum wells are clearly seen for both the (100) surface and the (411)A surface. Notable are the full widths at half maxima (FWHMs) of the luminescence peaks. The FWHMs of the luminescence peaks from the quantum wells of the 2.3 nm, 3.5 nm and 4.6 nm well widths of the (411)A surface are narrower than those of the luminescence peaks from the (100) surface.

Figure 9:
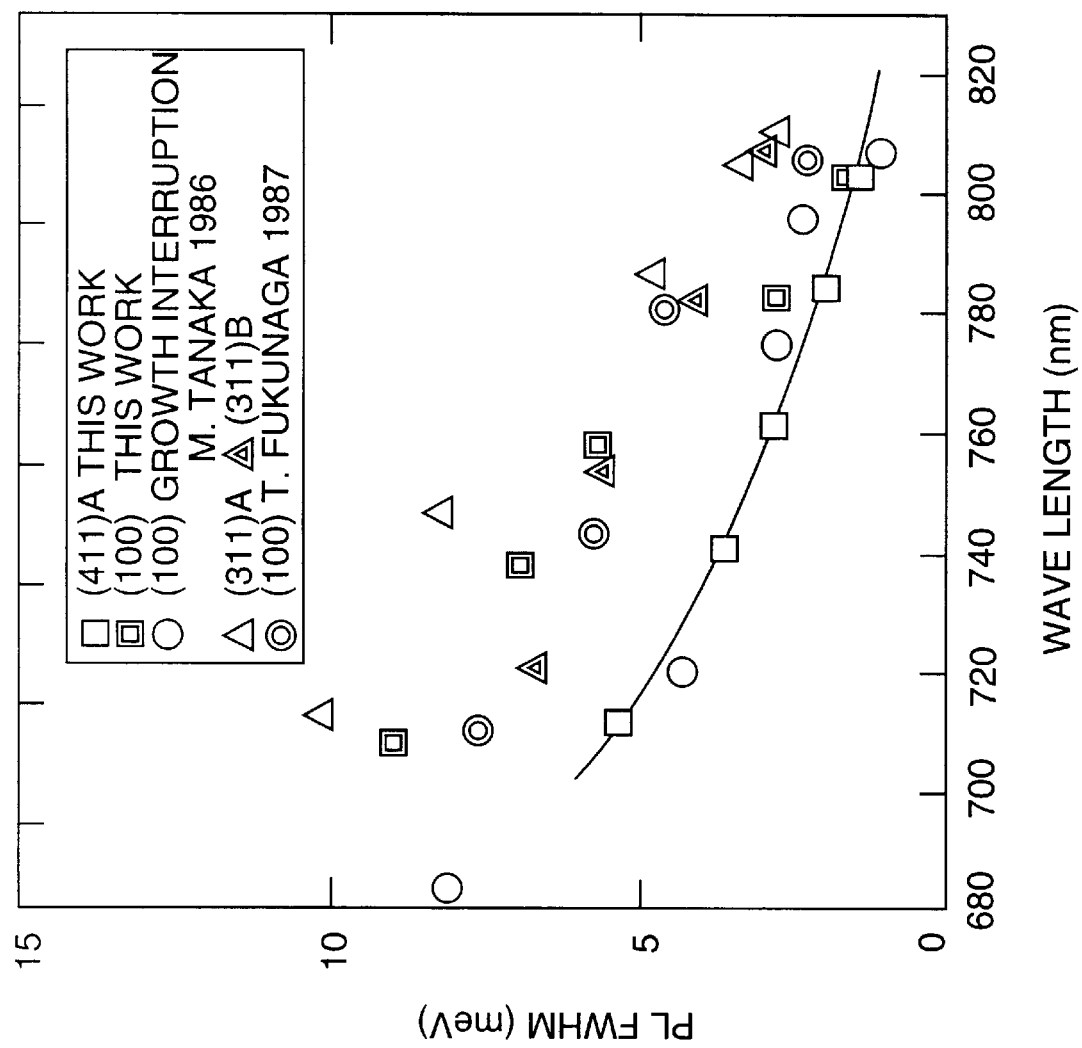
FIG. 9 is a graph of full widths at half maxima (FWHMs) of the luminescence peaks of the GaAs/AlGaAs quantum wells.

In FIG. 9, the FWHMs are plotted in relation to the luminescence wave length. This figure too illustrates significant improvement in the luminescence on the (411)A surface over that on the (100) surface, demonstrating the FWHMs from the quantum wells on the (411)A surface being approximately as half narrow as those on the (100) surface. The result shows very small fluctuation of the quantized energy level in the quatumn wells on the (411)A substrate. It is also noteworthy that the integrated luminescence intensities for the quantum wells on the (411)A substrate were almost the same as those on the (100) substrate.

The FWHMs of the luminescence peaks from the quantum wells of both the (411)A and (100) substrates are plotted as a function of luminescence wave-length in FIG. 9, together with reported values of GaAs/AlGaAs quantum wells.

Those previously reported qauntumn wells having narrow FWHMs were grown on the (100) substrates with the growth interruption. In spite of the absence of the growth interruption, the quantum wells grown on the (411)A surface, according to the method of the present invention, achieved FWHMs as narrow as or even narrower than the conventionally achieved quantum wells, indicating that a very atomically-flat hetero-interface can be obtained without such special treatment as the growth interruption.

Moreover, it is notable that the luminescence peak is only one for each quantum well on the (411)A substrate, even when the excitation area was of about 200 um diameter, in contrast with three luminescence peaks for each quantum well grown on (100) substrates with the growth interruption, as shown schematically in FIG. 10. This result indicates that there is no variation in quantum well width by the amount of mono-layer steps over the macroscopic area of the laser excitation (200 um diameter) on the (411)A substrates. In other words, by using the (411)A GaAs substrates we could achieve for the first time the formation of effectively atomically-flat GaAs/AlGaAs interfaces over the macroscopic area which is much larger than a contact area of usual semiconductor devices.

Hence, this technique is expected to open window for utilizing effectively atomically-flat interfaces over a large area in the hetero-structure devices, such as lasers, detectors and electron devices with a resonant tunneling barrier structure or a tunnel barrier, such as RHET (resonant tunneling hot electron transistor), THETA (tunneling hot electron transistor), RBT (resonant tunneling bipolar transistor), etc, which will result in much improved device characteristics in the near future.

Incidentally, although the above-described embodiment relates to III–V compound semiconductor hetero-structures on (411)A GaAs substrates, the present invention is applicable also to III–V compound semiconductor hetero-structures on (411)A InP substrates. Further, in the above embodiment, the MBE system was used as the crystal growth system. However, other systems such as a metalorganic chemical deposition (MOCVD) system or other types of MBE system such as using gas sources can be employed instead.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which become within the meaning and range of equivalency of the claims are therefore intended to be embraced therein.

What is claimed is:

1. A method of forming a GaAs/AlGaAs hetero-structure comprising the steps of:

preparing a GaAs substrate having a (411)A-oriented surface;

setting the GaAs substrate inside a growth container with the (411)A surface being disposed as a surface of crystal growth thereon;

reducing a pressure inside said growth container and then heating said GaAs substrate up to a predetermined temperature sufficient to cause epitaxial growth of Ga, Al, and As on said GaAs substrate under an $As_4/Ga$ pressure ratio of 10; and forming a GaAs/AlGaAs hetero4ayer on said (411)A-oriented GaAs substrate, said GaAs/AlGaAs hetero-layer including at least a surface of an epitaxially grown AlGaAs layer as a heterointerface thereof.

2. The method according to claim 1, wherein said predetermined temperature is 580° C.

3. A method of forming a GaAs/AlGaAs layer comprising the steps of:

preparing a GaAs substrate having a (411)A-oriented surface;

setting the GaAs substrate inside a molecular beam epitaxy (MBE) with the (411)A surface being disposed as a surface of crystal growth thereon;

reducing a pressure inside a growth chamber of said MBE system and then heating said GaAs substrate up to a predetermined temperature sufficient to cause epitaxial growth of GaAs or AlGaAs on said GaAs substrate under an $As_4/Ga$ pressure ratio of 10; and forming a GaAs/AlGaAs hetero-structure on said (411)A surface of the GaAs substrate.

4. A method producing an AlGaAs/GaAs/AlGaAs quantum well comprising the steps of:

preparing a GaAs substrate having a (411)A-oriented surface;

setting the GaAs substrate inside a growth container with the (411)A surface being disposed as a surface of crystal growth thereon;

reducing pressure inside said growth container and then causing sequential epitaxial growths of an AlGaAs layer, a GaAs layer having a width for forming a quantum well, and a further AlGaAs layer one on another.

5. The method according to claim 4, wherein said epitaxial growths are effected under the conditions of an $As_4/Ga$ pressure ratio of 10 and a temperature of 580° C.

* * * * *